(12) United States Patent
Barina et al.

(10) Patent No.: US 7,236,369 B2
(45) Date of Patent: Jun. 26, 2007

(54) TORSION SPRING FORCE AND VERTICAL SHEAR PIN RETENTION OF HEAT SINK TO CPU

(75) Inventors: Richard M. Barina, Wellington, FL (US); Michael D. French, Raleigh, NC (US); Dean F. Herring, Youngsville, NC (US); John P. Scavuzzo, Rougemont, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 11/079,851

(22) Filed: Mar. 14, 2005

(65) Prior Publication Data

US 2006/0203452 A1    Sep. 14, 2006

(51) Int. Cl.
*H05K 7/20* (2006.01)
(52) U.S. Cl. .................. 361/719; 361/704; 257/719; 24/458; 24/513
(58) Field of Classification Search .................. None
See application file for complete search history.

(56) References Cited

U.S. PATENT DOCUMENTS

| 5,251,101 | A | * | 10/1993 | Liu | 361/717 |
| 5,323,845 | A | * | 6/1994 | Kin-shon | 165/80.3 |
| 5,448,449 | A | | 9/1995 | Bright et al. | |
| 5,678,627 | A | | 10/1997 | Lee | |
| 6,344,971 | B1 | * | 2/2002 | Ju | 361/704 |
| 6,549,412 | B1 | | 4/2003 | Ma | |
| 6,625,021 | B1 | | 9/2003 | Lofland et al. | |
| 6,654,254 | B2 | | 11/2003 | Szu et al. | |
| 6,768,641 | B2 | | 7/2004 | Li | |
| 6,788,538 | B1 | | 9/2004 | Gibbs et al. | |
| 6,822,869 | B2 | * | 11/2004 | Huang et al. | 361/704 |
| 6,904,650 | B2 | * | 6/2005 | Chen et al. | 24/517 |
| 7,142,430 | B2 | * | 11/2006 | Lee et al. | 361/719 |
| 2003/0214787 | A1 | * | 11/2003 | Liu | 361/704 |
| 2006/0018097 | A1 | * | 1/2006 | Lee et al. | 361/704 |

FOREIGN PATENT DOCUMENTS

JP    2002261212    9/2002
JP    2002261213    9/2002

* cited by examiner

*Primary Examiner*—Boris Chervinsky
(74) *Attorney, Agent, or Firm*—Martin McKinley, Esq.; Steven M. Greenberg, Esq.; Carey Rodriguez Greenberg & Paul LLP

(57) ABSTRACT

A heat sink retention assembly for retaining a heat sink in thermal contact with a CPU while transmitting load away from the CPU. The heat sink retention assembly includes a frame sized to receive the heat sink, the frame including opposing pin capture channels and a wire module. The wire module includes an upper handle section and a lower pivoting section. The wire module is pivotably coupled to the frame at the lower pivoting section. The wire module further includes opposing end pins, wherein each pin is moveably retained within and extends through a corresponding pin capture channel such that when the wire module is rotated with respect to the frame, the pins travel within their respective channels in order to engage the heat sink.

19 Claims, 4 Drawing Sheets

US 7,236,369 B2

TORSION SPRING FORCE AND VERTICAL SHEAR PIN RETENTION OF HEAT SINK TO CPU

BACKGROUND OF THE INVENTION

1. Statement of the Technical Field

The present invention relates to heat sinks and more particularly to a method and apparatus of securing a heat sink above a central processing unit (CPU) of a computer in order to divert the weight and force of the heat sink to the computer's chassis or mounting plate rather than toward the CPU while maintaining the requisite thermal interface with the CPU.

2. Description of the Related Art

Heat sinks are a vital part of any computer system. The heat generated by continued and extended use of a computer can severely damage the electrical components in the computer. Heat sinks provide a way for the heat to be transferred away from the source and away from critical components. To increase the amount of thermal transfer, heat sinks typically include a large surface area or a large number of thermally conductive fins. However, the problem that arises when large heat sinks or heat sinks with a large number of fins are used is that critical space within the confines of the computer chassis is used up. Also, heavy heat sinks must be secured directly to the computer chassis in order to avoid transmitting the direct weight of the heat sink on the CPU.

The contact area between the heat sink and the electrical components and the pressure at the point of contact between the heat sink and the heat source are also important considerations in heat sink design. A heat sink with a flat contact area is preferred since a thinner layer of thermal compound may be used. This reduces the thermal resistance between the heat sink and the heat source. The pressure between the heat sink and the heat source must be high in order to maintain the requisite thermal contact and to facilitate thermal flow. Mechanical clips may help maintain the requisite pressure between the surface of the heat sink and the CPU, but such clips are usually difficult to install and are not reliable when the computer is being shipped. Even a slight jarring during shipping may cause the weight of the heat sink to fall directly on the CPU or motherboard causing severe damage. Further, because of the increased thickness in motherboards, the use of an under-the-board spring to dampen the force exhibited by the heat sink on the CPU and other electrical components is no longer feasible.

The recent proliferation of Land Grid Array (LGA) sockets have created another problem that must be considered during heat sink design and particularly in the manner in which heat sinks or other cooling devices are attached to the socket/CPU assembly. Current LGA socket designs frequently contain heat sinks as part of the assembly. The heat sink base is usually used as one of the loading plates in the assembly and is typically attached to a back-side stiffener using multiple screws or spring-loaded threaded fasteners. Even these simple attachment means can consume a significant portion of the effective heat sink volume, since the screws or spring-loaded fasteners protrude through the heat sink and require removal or partial removal of some of the fin structure, thereby reducing its thermal efficiency. Additionally, deflection that might occur under actuation load can create gaps between the heat sink and the assembly that can compromise the thermal effectiveness of the heat sink and/or cause the weight of the heat sink to fall directly on the CPU.

It is therefore desirable to have an apparatus and method that allows a heat sink to be mounted above a CPU and to deliver a load commensurate with the required thermal flow characteristics of the heat sink and to provide a mechanism to hold the heat sink firmly in place with the weight of the heat sink being transmitted to the chassis or mounting plate of the computer rather than the CPU, motherboard or other critical components of the computer.

SUMMARY OF THE INVENTION

The present invention addresses the deficiencies of the art with respect to heat sink retention assemblies and provides a novel and non-obvious apparatus and method for securing a heat sink to the chassis of a computer while maintaining thermal contact between the heat sink and the CPU. In this regard, a mechanical retention assembly is provided and actuated by the user. The assembly, upon actuation, advantageously prevents the heat sink from separating from the CPU, affixes the heat sink to the chassis of the computer, removes the load from the CPU, and provides mechanical support and stability to the heat sink.

According to one aspect, the present invention provides a heat sink retention assembly having a frame sized to receive the heat sink, the frame including opposing pin capture channels, and a wire module having an upper handle section and a lower pivoting section. The wire module is pivotally coupled to the frame at the lower pivoting section. The wire module also includes opposing end pins, wherein each pin is moveably retained within and extends through a corresponding pin capture channel such that when the wire module is rotated with respect to the frame, the pins travel within their respective channels in order to engage the heat sink.

According to another aspect, the present invention provides a heat sink assembly for maintaining contact with an electrical component. The assembly includes a heat sink having an upper and a lower surface. The heat sink includes ramped slots along its lower surface, and a frame sized to receive the heat sink. The frame includes opposing pin capture channels. The heat sink assembly also includes a wire assembly having an upper handle section and a lower pivoting section. The wire assembly is pivotally coupled to the frame and includes opposing pins, where each pin is moveably retained within and extends through a corresponding channel of the frame such that when the wire assembly is rotated with respect to the frame, the pins travel within their respective channels in order to engage one of the ramped slots of the heat sink.

According to still another aspect, a method of maintaining contact between a heat sink and an electronic component in a computer while transmitting load away from the electronic component is provided. The method includes affixing a heat sink retention assembly to a computer motherboard, where the heat sink retention assembly includes a frame positioned over the electrical component and sized to receive the heat sink, placing the heat sink proximate the electrical component such that the heat sink fits within the frame of the heat sink retention assembly, and activating the heat sink retention assembly such that the heat sink maintains contact with the electrical component while transmitting the load of the heat sink to the heat sink retention assembly.

In yet another aspect of the invention, a latching mechanism for maintaining an interface between a first object and a second object is provided. The latching mechanism includes a frame positioned over the second object and sized to receive the first object, the frame having opposing pin capture channels, where the first object includes ramped entry slots disposed along its lower surface. The latching mechanism also includes a wire assembly having an upper handle section and a lower pivoting section. The wire assembly is pivotally coupled to the frame at the lower pivoting section, and includes opposing end pins, where each pin is moveably retained within and extends through a corresponding pin capture channel such that when the wire assembly is rotated with respect to the frame, the pins travel within their respective channels in order to engage one of the ramped entry slots of the first object.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE PREFERRED EMBODIMENTS

The present invention advantageously provides a method and apparatus for mounting a heat sink above an electrical component in a computer, such as a CPU, such that the heat sink is in thermal contact with the CPU but the weight of the heat sink is absorbed by the computer chassis or CPU mounting plate and not the CPU. When used with Land Grid Array (LGA) CPU technology, the present invention advantageously provides an apparatus that secures the heat sink to the motherboard or CPU of the computer and prevents unwanted separation between the heat sink and the CPU which might occur due to the solder connection between the CPU and its socket.

Figure 1:
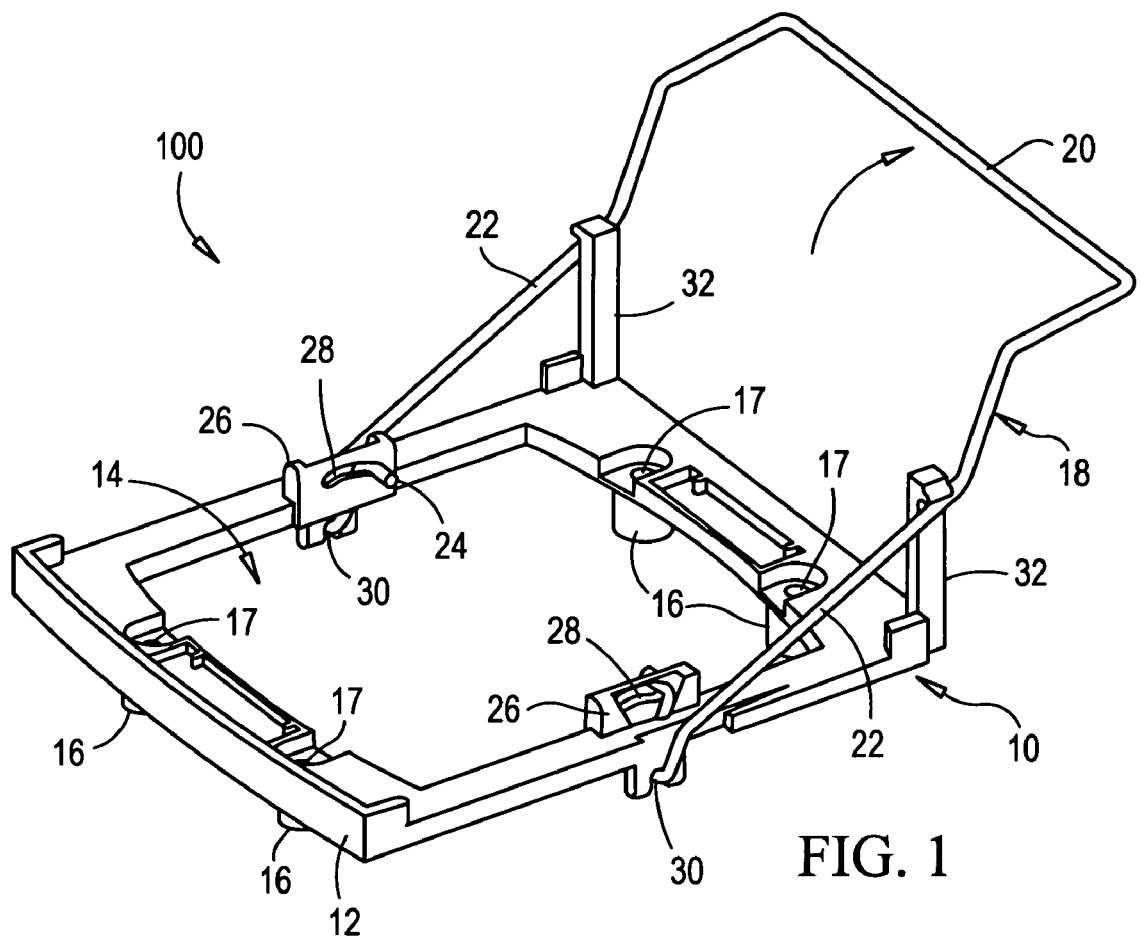
FIG. 1 is an illustration of an exemplary apparatus constructed in accordance with the principles of the present invention.

Referring now to the drawing figures in which like reference designators refer to like elements there is shown in FIG. 1 an apparatus constructed in accordance with the principles of the present invention and designated generally as "100". Apparatus 100 includes a retention module assembly 10, which is adapted for placement on top of a motherboard or Central Processing Unit (CPU) and socket assembly of a personal computer. Assembly 10 includes a frame 12, which provides a border around a central, open area 14, to allow for placement of a heat sink therethrough. It is contemplated that frame 12 of assembly 10 is sized to allow a heat sink of a specified size to fit through opening 14 in order to contact a CPU without the heat sink resting on frame 12. A plurality of standoffs 16 extend from the bottom surface of frame 12. Each standoff 16 is received by a corresponding mounting hole in the motherboard placed on top of the computer's chassis. Affixing devices such as screws or bolts may be inserted at affixing point 17 to firmly affix frame 12 to the motherboard or other surface of the computer.

Assembly 10 includes a wire module 18, which includes a handle section 20, and opposing side sections 22, which each terminate in a wire module pin 24. The lower potion of each side section 22 is bent in such a fashion as to pass under and through a pin capture bracket 26. A pair of brackets 26 are affixed to opposing sides of frame 12 as shown in FIG. 1. Each bracket 26 includes a pin capture track 28 through which a corresponding wire module pin 26 extends. Track 28 is slightly curved in order to facilitate movement of pin 24 therein when handle 20 is rotated.

Initially, handle 20 is an unlatched position where it is positioned substantially upright with respect to frame 12. In this position, a heat sink may be placed above the wire module pins 24 thus securing the heat sink (discussed below). When handle 20 is pulled back in the direction of the arrow shown in FIG. 1, the upper portion of each side section 22 of wire module 18 is locked in place by wire module retention column 32. This secures wire module 18 in a latched position. The retention columns 32 shown in FIG. 1 are merely illustrative of an exemplary embodiment. Other types of wire retention methods commonly known in the art may be used.

When handle 20 of wire module 18 is rotated from an unlatched to a latched position in the direction of the arrow, each pin 24 moves within track 28, in the same direction as handle 20. Due to the arcuate shape of track 28, each pin 24 travels in a slight arc within its corresponding track 28. The arcuate shape of track 28 advantageously allows wire module 18 to pivot freely. The movement of pins 24 within their respective tracks assist in retaining the heat sink to assembly 10 (discussed below).

A pivot point 30 is created where the lower portion of side section 22 is captured within a lower slot in bracket 26. When handle 20 is rotated, load is transmitted to each pin 24 via the captured wire portion at pivot point 30. The rotation of pin 24 is constrained by the arcuate dimensions of the capture track 28 in which it travels. While in track 28, tip 24 cannot move up or down, but is forced to move along track 28 as handle 20 of wire module 18 is rotated.

Figure 2:
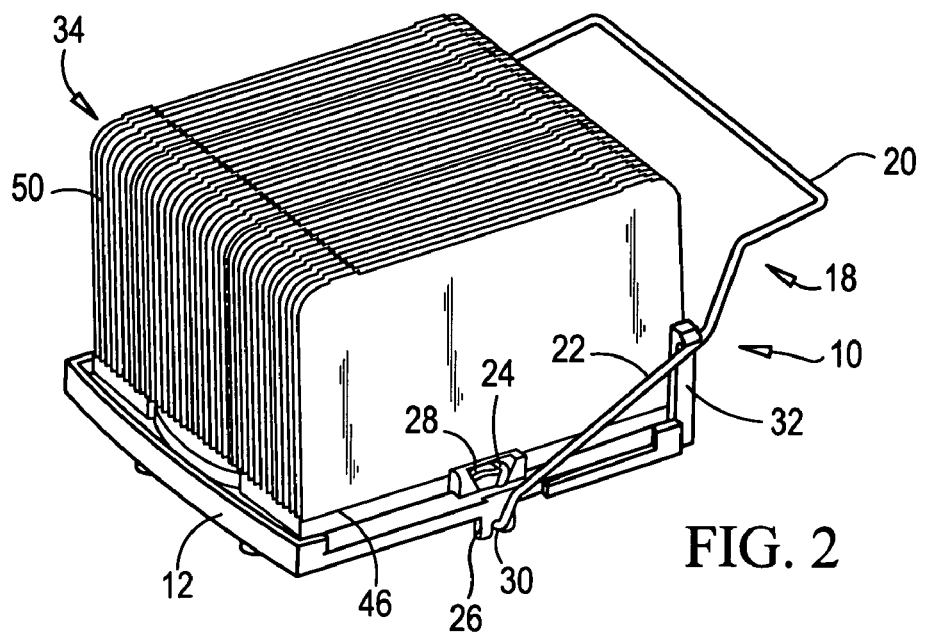
FIG. 2 illustrates the retention assembly of the present invention interfacing with a heat sink.

In FIG. 2, a heat sink 34 is placed within frame 12 of the retention module assembly 10. Heat sink 34 is typically made of a solid metal base 46 such as aluminum or copper, with heat dissipation fins 50 mounted on and above the base 46. As described above, frame 12 is sized to receive heat sink 34. Heat sink 34 fits within the opening 14 of frame 12 but does not rest on any portion of the frame 12. In FIG. 2, handle 20 can be seen in the latched or "loaded" position. Although not shown, the tip of each pin 24 extends beneath heat sink 34. Pin 24 can be seen within track 28. As handle 20 is rotated, a torsion load is applied to wire module pins 24 as the lower portions of side sections 22 remain captured within bracket 26 at pivot point 30. Again, after rotation, side sections 22 may be secured within their respective capture columns 32.

Figure 3:
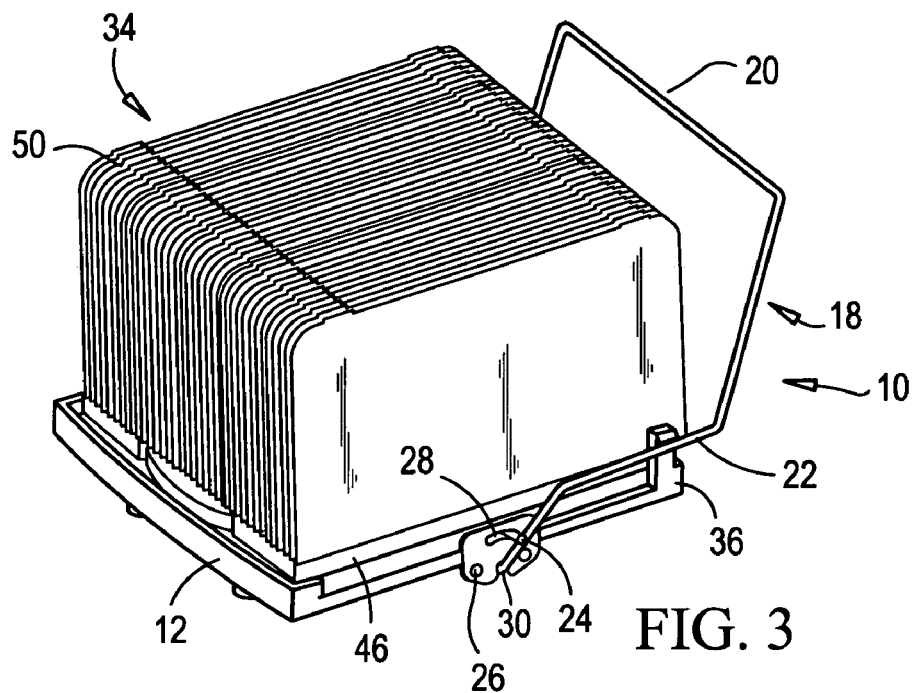
FIG. 3 illustrates an alternate embodiment of the retention assembly of the present invention.

FIG. 3 illustrates an alternate embodiment of the retention module assembly 10 described above and shown in FIG. 1. In this embodiment, a heat sink 34 has been placed upon frame 12. However, the wire module pin configuration of assembly 10 is slightly different than what is shown in FIG. 1. Instead of each pin 24 being formed to extend past bracket 26 within the perimeter of frame 12, in this embodiment, each pin 24 extends through bracket 26 but outside the perimeter of frame 12. Thus, the present invention is not limited by the design, shape or orientation of pin 24. Depending upon the size and shape of heat sink 34, the CPU and the socket in which the CPU resides (in an LGA configuration), pins 24 can be configured in any number of ways in order to allow heat sink 34 to be placed securely upon the pins 24 and within frame 12. In the alternate embodiment of FIG. 3, a pair of shorter brackets 36 retain side sections 22 of wire module 18 when in the latched, or "loaded" position.

Because heat sinks may be large and heavy, the present invention advantageously provides a method and apparatus divert the direct weight of the heat sink 34 away from critical electrical components in a computer such as the CPU. Pins 24 receive the weight of heat sink 34 instead of the CPU. Frame 12, which is bolted to the frame of the computer (either the motherboard or the chassis) receives the load from the heat sink 34 and transmits it down to the computer chassis, thus protecting the CPU and the motherboard from unwanted weight from the heat sink 34. However, because heat sink 34 fits within frame 12 and frame 12 has been placed directly above the CPU, the required thermal contact between heat sink 34 and the CPU is still maintained.

Figure 4:
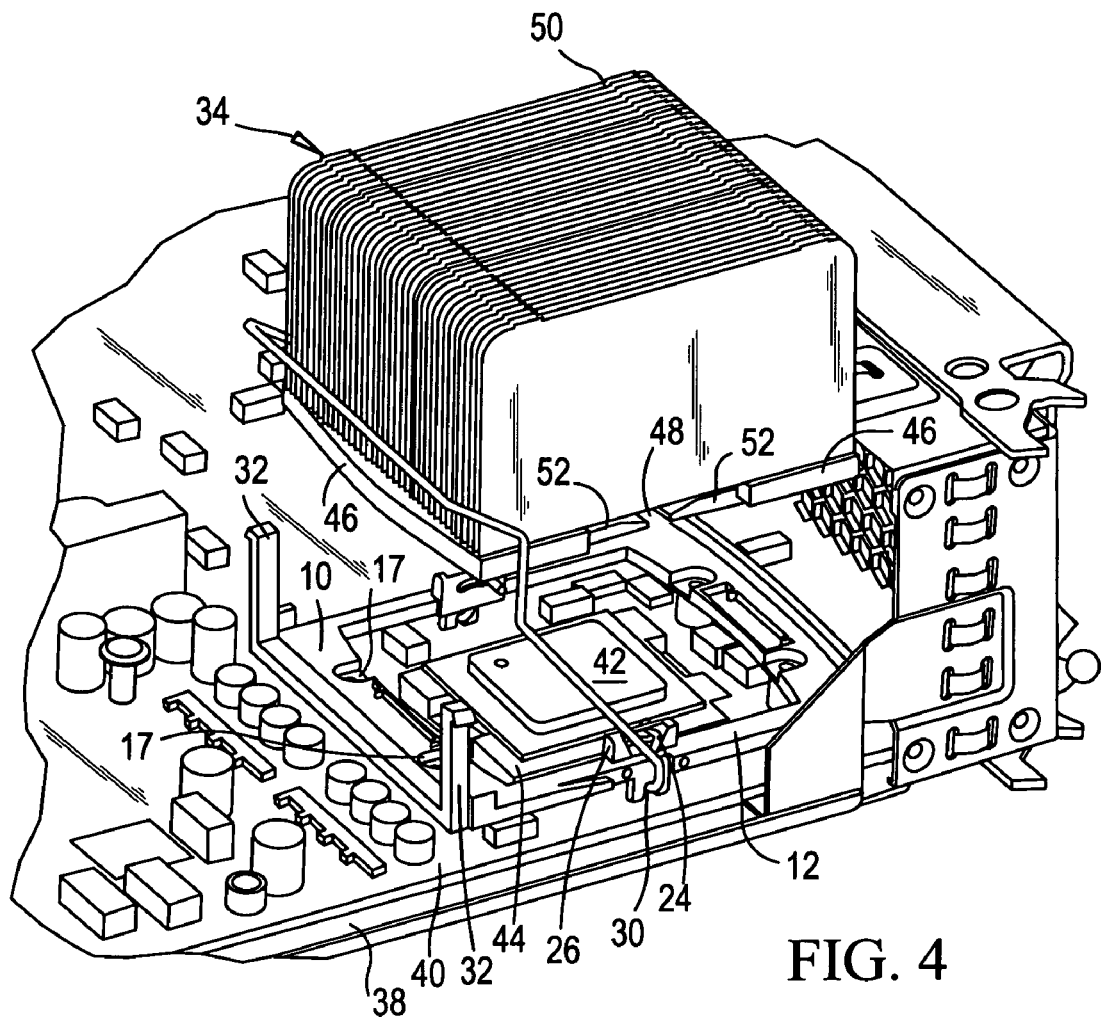
FIG. 4 illustrates the dual sloped entry ramps of the heat sink which receive the wire module pin of the retention assembly.

The latching mechanism that allows heat sink 34 to maintain the requisite pressure against the CPU in order to achieve sufficient thermal transfer will now be discussed. FIG. 4 illustrates the inside of a personal computer that is to receive heat sink 34. Metal chassis 38 is partially covered by a motherboard 40, upon which assembly 10 is placed. Motherboard 40 rests on a plurality of standoffs (not shown) that protrude upward from chassis 38. Motherboard 40 is situated between the top of the standoffs and the bottom of frame 12 and secured with screws, bolts or other affixing means through affixation points 17 of the frame 12.

CPU 42 is situated within a socket 44, which is common in Land Grid Array (LGA) designs. Assembly 10 is placed over CPU 42 and its socket 44 and is affixed to chassis 38. Heat sink 34 clears frame 12 and extends through the interior space 14 formed by frame 12. Frame 12 includes its own standoffs 16 (shown in FIG. 1), which fit into mounting holes (not shown) in board 40. Thus, assembly 10 is secured within board 40 and is ready to receive heat sink 34.

From FIG. 4, it is evident that heat sink 34 has been modified to receive wire module pins 24 of wire module 18. Specifically, heat sink 34 includes a lower frame 46, which has a central longitudinal groove 48, the end of which can be seen in FIG. 4. Groove 48 is formed by opposing sloped ramps 52. Each ramp 52 increases in thickness as it gets further away from groove 48, i.e., the center of heat sink 34. Groove 48 runs the substantial length of the bottom of heat sink 34 and is sized to receive pins 24 of wire module 18 when heat sink 34 is placed over frame 12. The width of groove 48 and dimensions of ramps 52 may vary depending upon the size and orientation of pins 24.

In order to load heat sink 34 upon assembly 10, handle 20 must be positioned such that each wire module pin 24 is in the relative center of its respective track 28. In this fashion, when heat sink 34 is lowered over CPU 42 and within frame 12, each pin 24 fits within groove 48 of heat sink 34. This is the unloaded or "unlatched" position. At this time, heat sink 34 is in not yet in contact with CPU 42, and is not secured to assembly 10. Thus, assembly 10 must be "actuated" in order to "lock" heat sink 34 to assembly 10 and "press" heat sink 34 against CPU 42 in order to initiate thermal contact. Upon loading, the weight of heat sink 34 is supported by pins 24 of assembly 10 and chassis 38, and not by CPU 42. However, the required contact between heat sink 34 and the top of CPU 42 in order to allow for thermal transition, is maintained.

Figure 5:
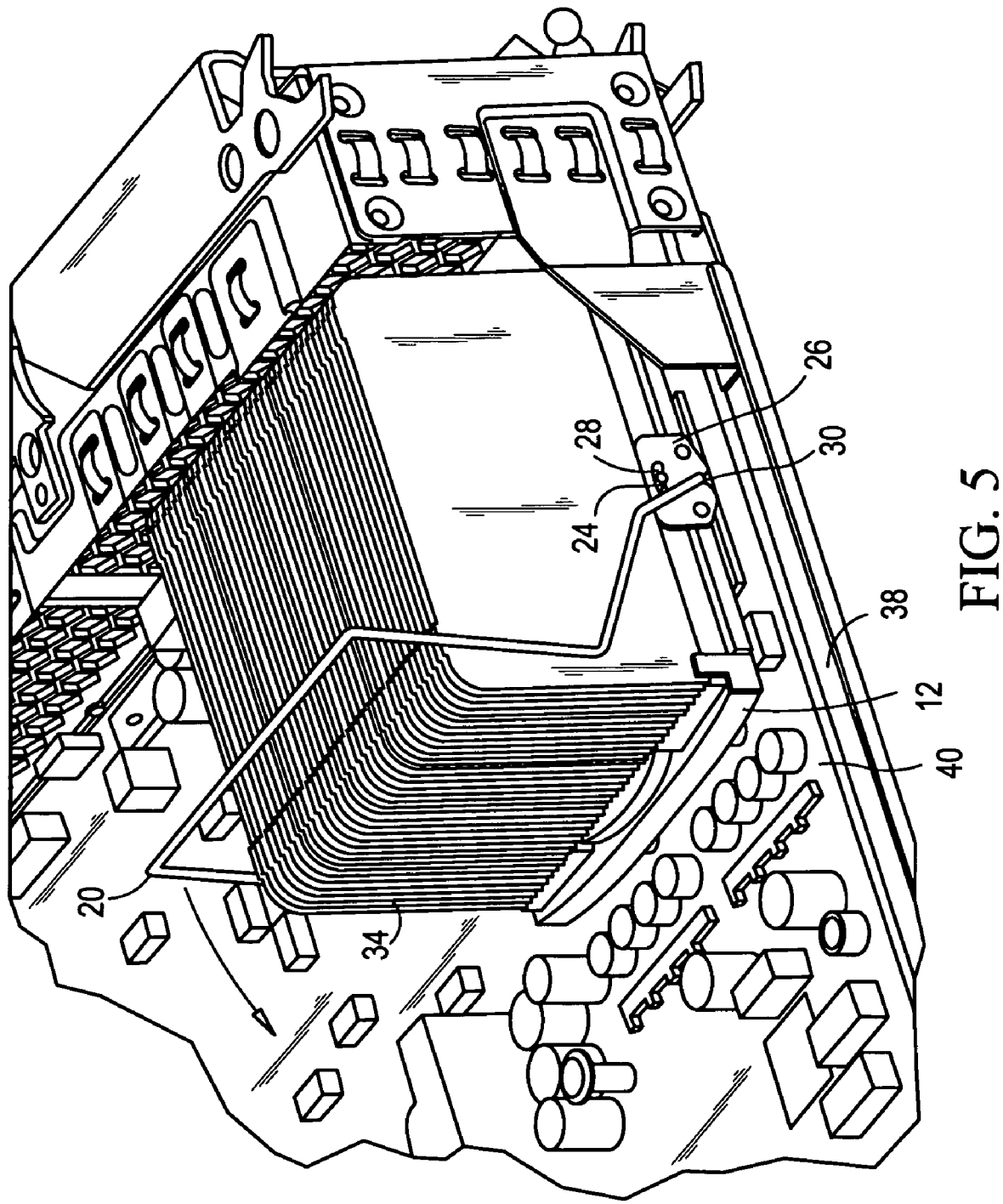
FIG. 5 shows the retention assembly interfacing with a heat sink after the heat sink has been placed upon the wire assembly pins of the retention assembly in an unlatched position.

Referring again to FIG. 4, the sloped ramps 52 and groove 48 of heat sink 34 can be seen. Further, pin 24 of wire module 18 can also be seen as it extends through track 28 of bracket 26 and is situated directly beneath heat sink 34 and aligned with groove 48. Although FIG. 4 illustrates the use of a retention module assembly 10 of the type used in FIG. 1 where the wire module pins 24 extend within the border of frame 12, the alternate embodiment shown in FIG. 3 may also be used, where pins 24 extend outside of frame 12. FIG. 5 illustrates use of this alternate embodiment.

It is envisioned that when heat sink 34 is placed within frame 12 with handle 20 in an unlocked position, pins 24 are in the substantial midpoint of their respective tracks 28 and under groove 48. In FIG. 5, handle 20 is still in an unlatched position as evidenced by the position of pin 24 in the relative center of track 28. Pins 24 are now positioned within groove 48 and heat sink 34 is positioned above CPU 42. Heat sink 34 clears the top of frame 12 and does not contact the frame. Instead, it fits entirely within space 14 of frame 12.

Figure 6:
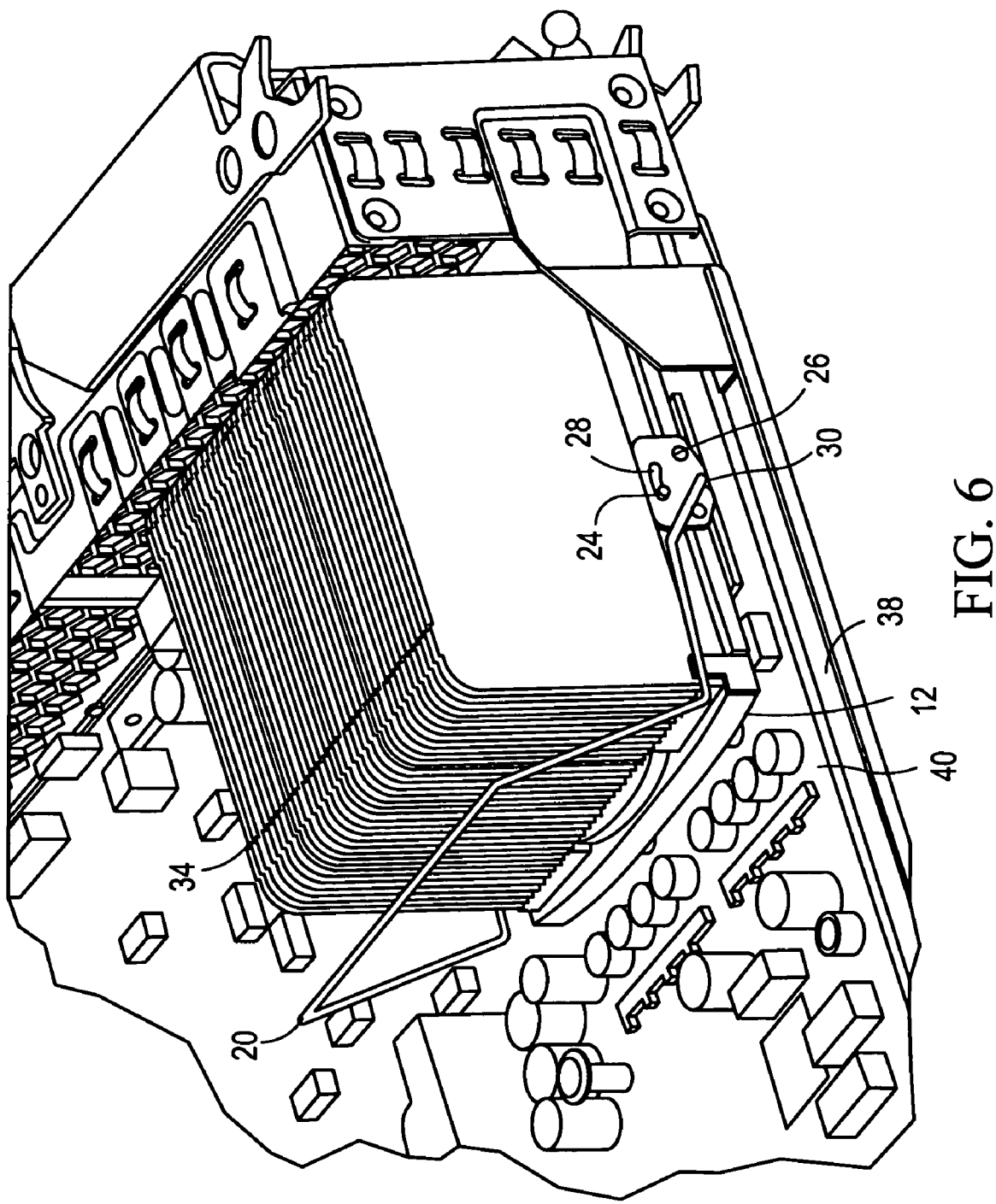
FIG. 6 shows the retention assembly interfacing with a heat sink in a latched position after activation of the wire module of the retention assembly.

In FIG. 6, a user has rotated handle 20 in order to "lock" heat sink 34 to assembly 10. By rotating handle 20, pins 24 are rotated in the same direction due to the fixed portion of the wire module trapped in bracket 26 at pivot point 30. As pin 24 travels along the arcuate path formed by track 28, it slides into the space between sloped ramp 52 and the bottom surface of heat sink 34. This space is clearly seen in the illustration of FIG. 4. Because ramp 52 is sloped, i.e., it becomes gradually wider away from groove 48, and the space between the heat sink 34 and ramp 52 becomes smaller. Thus, when handle 20 is rotated, wire module 18 acts as a torsion spring, forcing heat sink 34 down onto pins 24. Therefore, pins 24 provide the support for heat sink 34 and essentially "lock" heat sink 34 to assembly 10. At this time, heat sink 34 is brought down on the top of CPU 42. When heat sink 34 makes contact with CPU 42 and is no longer in motion, the torque load is applied.

When in the latched or loaded position, heat sink 34 is prevented from moving up or down during shipping or other events and is "clamped" onto assembly 10 by the interaction of pins 24 within the space above the sloped ramps 52 of heat sink 34. The entire load of heat sink 34 is transmitted to assembly 10 down through chassis 38 and its standoffs. Advantageously, although the load is transmitted down through assembly 10 and away from motherboard 40 and CPU 42, the original thermal contact between heat sink 34 and CPU 42 remains.

To unlatch heat sink 34 from retention assembly 34, the user simply rotates handle 20 back to its initial position, thereby moving pins 24 to the substantial center of their tracks 28. This releases pins 24 from their captured orientation above sloped ramps 52 and returns pins 24 to groove 48. The heat sink 34 is no longer latched onto assembly 10 and may be easily removed. Heat sink 34 is moved vertically off CPU 42 by the rotation of handle 20 to its initial position.

It should be noted that the present invention is not limited to a latching mechanism between a heat sink and a CPU. Rather, the retention assembly described herein is equally adaptable to situations where there is a need to maintain contact between two objects. Frame 12 of assembly 10 is placed over an object and secured to a support surface. The second object is placed over the first object and within frame 12. The unique pin construction of the wire module 18 of the present invention allows for the handle 20 to be rotated and the pins to be inserted into a corresponding receiving ramp situated on the bottom surface of the second object. Once the assembly 10 has been actuated, the pins 24 provide a secure clamping mechanism to maintain contact between the two objects.

It should also be noted that handle 20 need not be rotated completely to activate assembly 10. Depending upon the specific circumstances, handle 20 may only need to be rotated a small amount thus forcing pins 24 only partway within track 28. This might be applicable in situations where there needs to be only a limited amount of pressure between the two objects. Assembly 10 therefore provides the user with the ability to achieve a wide range of possible clamping positions.

We claim:

1. A heat sink retention assembly comprising:
   a frame sized to receive a heat sink, the frame having opposing pin capture channels; and
   a wire module including an upper handle section and a lower pivoting section, the wire module pivotally coupled to the frame at the lower pivoting section, the wire module including opposing end pins, wherein each said pin is moveably retained within and extends through a corresponding pin capture channel such that when the wire module is rotated with respect to the frame, the pins travel within their respective channels in order to engage the heat sink.

2. The heat sink retention assembly of claim 1, wherein the pin capture channels have an arcuate shape in order to allow the wire module pins to travel in an arc within the pin capture channels as the wire module is rotated.

3. The heat sink retention assembly of claim 1, wherein the frame further comprises wire module retention columns to retain the wire module handle section in place after the wire module pins have engaged the heat sink.

4. The heat sink retention assembly of claim 1, the frame further comprising opposing pivot brackets, each said pivot bracket retaining a corresponding pivoting section of the wire module such that when the wire module handle is rotated, each said pivoting section is pivotally retained within the pivot brackets thereby allowing the wire module pins to move within their respective pin capture channel.

5. The heat sink retention assembly of claim 1, wherein the opposing wire module pins are adapted to engage ramped entry slots formed on the underside of the heat sink.

6. The heat sink retention assembly of claim 5, wherein the wire module is rotatable from a non-latching position where the wire module pins are not engaged with the ramped entry slots of the heat sink to a latching position where the wire module pins engage one of the ramped entry slots such that when the wire module is in the latching position, the heat sink is secured to the heat retention assembly while maintaining contact with electrical components through the frame.

7. The heat sink retention assembly of claim 6, wherein the heat sink does not contact a wire module frame when the wire module is in the latching position.

8. A heat sink assembly for maintaining contact with an electrical component, the assembly comprising:
   a heat sink having an upper and a lower surface, the heat sink including ramped slots along its lower surface;
   a frame sized to receive the heat sink, the frame having opposing pin capture channels; and
   a wire assembly including an upper handle section and a lower pivoting section, the wire assembly pivotally coupled to the frame, the wire assembly including opposing pins, wherein each said pin is moveably retained within and extends through a corresponding channel of the frame such that when the wire assembly is rotated with respect to the frame, the pins travel within their respective channels in order to engage one of the ramped slots of the heat sink.

9. The heat sink assembly of claim 8, wherein the pin capture channels have an arcuate shape in order to allow the wire assembly pins to travel in an arc within the capture channels as the wire assembly is rotated.

10. The heat sink assembly of claim 8, wherein the frame further comprises wire assembly retention columns to retain the wire assembly in place after the wire assembly pins have engaged the heat sink.

11. The heat sink assembly of claim 8, the frame further comprising opposing pivot brackets, each said pivot bracket retaining a corresponding pivoting section of the wire assembly such that when the wire assembly handle is rotated, each said pivoting section is pivotally retained within the pivot brackets thereby allowing the wire assembly pins to move within their respective pin capture channel.

12. The heat sink assembly of claim 11, wherein the wire assembly is rotatable from a non-latching position where the wire assembly pins are not engaged with the ramped slots of the heat sink to a latching position where the wire assembly pins engage one of the ramped entry slots such that when the wire assembly is in the latching position the heat sink is secured to the heat retention assembly while maintaining contact with electrical components through the frame.

13. The heat sink assembly of claim 12, wherein the heat sink does not contact a wire assembly frame when the wire assembly is in the latching position.

14. A method of maintaining contact between a heat sink and an electronic component in a computer while transmitting load away from the electronic component, the method comprising:
   affixing a heat sink retention assembly to a computer motherboard, the heat sink retention assembly comprising a frame positioned over the electrical component and sized to receive the heat sink;
   placing the heat sink proximate the electrical component such that the heat sink fits within the frame of the heat sink retention assembly; and
   activating the heat sink retention assembly such that the heat sink maintains contact with the electrical component while transmitting the load of the heat sink to the heat sink retention assembly; the frame further including opposing pin capture channels, the heat sink retention assembly further comprising: a wire module having an upper handle section and a lower pivoting section, the wire module pivotally coupled to the frame, the wire module including opposing end pins, each said pin moveably retained within and extending through a corresponding channel of the frame such that when the wire module is rotated with respect to the frame, the pins travel within their respective channels in order to engage the heat sink.

15. The method of claim 14, wherein the opposing wire module pins are adapted to engage ramped entry slots formed on the underside of the heat sink.

16. The method of claim 14, wherein activating the heat sink retention assembly comprises:
rotating the wire module handle section such that the wire module pins travel from a first, non-latching position within their channels to a second, latching position within their channels in order to engage the heat sink.

17. The method of claim 14, wherein the pin capture channels have an arcuate shape in order to allow the wire module pins to travel in an arc within the capture channels as the wire module is rotated.

18. The method of claim 14, wherein the heat sink does not contact a wire module frame when the wire module is activated.

19. A latching mechanism for maintaining an interface between a first object and a second object, the latching mechanism comprising:

a frame positioned over the second object and sized to receive the first object, the frame having opposing pin capture channels, wherein the first object includes ramped entry slots disposed along its lower surface; and a wire assembly including an upper handle section and a lower pivoting section, the wire assembly pivotally coupled to the frame at the lower pivoting section, the wire assembly including opposing end pins, wherein each said pin is moveably retained within and extends through a corresponding pin capture channel such that when the wire assembly is rotated with respect to the frame, the pins travel within their respective channels in order to engage one of the ramped entry slots of the first object.

* * * * *